(12) United States Patent
Kobrin

(10) Patent No.: US 8,334,217 B2
(45) Date of Patent: Dec. 18, 2012

(54) MATERIAL DEPOSITION OVER TEMPLATE

(75) Inventor: Boris Kobrin, Dublin, CA (US)

(73) Assignee: Rolith Inc., Pleasanton, CA (US)

( * ) Notice: Subject to any disclaimer, the term of this patent is extended or adjusted under 35 U.S.C. 154(b) by 826 days.

(21) Appl. No.: 12/455,938

(22) Filed: Jun. 8, 2009

(65) Prior Publication Data

US 2009/0305513 A1    Dec. 10, 2009

Related U.S. Application Data

(63) Continuation-in-part of application No. 12/384,167, filed on Apr. 1, 2009, now Pat. No. 8,182,982, and a continuation-in-part of application No. PCT/US2008/012901, filed on Nov. 18, 2008.

(60) Provisional application No. 61/131,445, filed on Jun. 9, 2008.

(51) Int. Cl.
  *H01L 21/30* (2006.01)
  *B05D 5/06* (2006.01)
  *B05D 1/32* (2006.01)

(52) U.S. Cl. .................. 438/758; 427/282; 257/E21.211

(58) Field of Classification Search .................. None
See application file for complete search history.

(56) References Cited

U.S. PATENT DOCUMENTS

| | | | |
|---|---|---|---|
| 5,725,788 A * | 3/1998 | Maracas et al. .................. 216/41 |
| 6,518,168 B1 | 2/2003 | Clem | |
| 7,875,313 B2 * | 1/2011 | Blanchet et al. .............. 427/282 |
| 8,182,982 B2 | 5/2012 | Kobrin | |
| 2004/0163758 A1 | 8/2004 | Kagan | |

FOREIGN PATENT DOCUMENTS

WO    2009094009    7/2009

OTHER PUBLICATIONS

J. Wang, Dewetting of Conducting Polymer Inkjet Droplets on Patterned Surface, Nature Materials, V.3, Mar. 2004, p. 171-176.
L. Creagh, Inkjet Printed Electronics: Moving to Production, Printed Electronics USA 2007, Nov. 13-14, San Francisco, CA.
Y. Xia, Soft Lithography, Annu.Rev.Mater.Sci, 1998, V. 28, p. 153-184.
U.S. Appl. No. 61/131,445, filed Jun. 9, 2008, entitled "Method and apparatus for material deposition over template".

* cited by examiner

*Primary Examiner* — Cynthia Kelly
*Assistant Examiner* — Anna Verderame
(74) *Attorney, Agent, or Firm* — Joshua D. Isenberg; JDI Patent

(57) ABSTRACT

Embodiments of the invention relate to a method of functional materials deposition using a polymer template fabricated on a substrate. Such template forms an exposed and masked areas of the substrate material, and can be fabricated using polymer resists or Self-assembled monolayers. Deposition is performed using an applicator, which is fabricated in the shape of cylinder or cone made of soft elastomeric materials or laminated with soft elastomeric film. Functional materials, for example, metals, semiconductors, sol-gels, colloids of particles are deposited on the surface of applicator using liquid immersion, soaking, contact with wetted surfaces, vapor deposition or other techniques. Then wetted applicator is contacted the surface of the polymer template and rolled over it's surface. During this dynamic contact functional material is transferred selectively to the areas of the template. Patterning of functional material is achieved by lift-off of polymeric template after deposition. According to another embodiment, where self-assembled monolayers are used as template, selective deposition of functional materials is achieved either due to low surface energy of SAM or reactivity of terminal groups.

20 Claims, 3 Drawing Sheets

MATERIAL DEPOSITION OVER TEMPLATE

This application claims the benefit of U.S. provisional Application No. 61/131,445 filed Jun. 9, 2008 and Continuation in part of PCT/US2008/012901 filed Nov. 18, 2008 and U.S. Ser. No. 12/384,167 filed Apr. 1, 2009.

FIELD

This invention relates to a new method of selective deposition of materials using polymer templates in continuous mode, conveyor-type or Roll-to-Roll modes.

BACKGROUND

This section describes background subject matter related to the disclosed embodiments of the present invention. There is no intention, either express or implied, that the background art discussed in this section legally constitutes prior art.

The conventional vacuum-based material deposition methods (CVD, ALD, PVD, etc.) are expensive and slow. Mass production of devices for high volume applications, like Solar cells, LEDs and Data storage media require lower cost high throughput processing. Other conventional material deposition methods, like spin-coating or immersion-coating are not practical for processing large substrates areas.

Some unconventional techniques for material deposition have been explored and demonstrated:
Inkjet printing technique can deposit various materials on variety of substrates inexpensively. Unfortunately, currently resolution of Inkjet printing is limited to >10 um and a drop placement accuracy +/−10 um, which is few orders of magnitude larger that required for emerging applications of Solar cells and LEDs efficiency enhancements or next generation Data storage patterned media application.
Wang et al suggested surface energy assisted inkjet printing, which uses surface energy patterns (templates) to improve resolution of inkjet printing. He used Self-assembled monolayers (SAMs) deposited from a vapour phase and patterned using E-beam lithography as a template. This work demonstrated polymeric material deposition with lines as thin as 500 nm. Vapor phase deposition of SAMs and E-beam writing require vacuum systems, which makes this approach costly. Moreover, E-beam method of pattern generation is very slow.

Another emerging technique, microcontact printing (uCP), discussed by Xia et al, uses the relief pattern on the surface of a PDMS stamp to form patterns of self-assembled monolayers (SAMs) on the surfaces of substrates by contact. Then conventional material deposition methods (CVD or spin-coating) are used to deposit functional materials on the surface using such SAM template, as for example, discussed by Clem et al. Similar scheme, suggested by Kagan et al, where conventional material deposition methods over SAM template are spin-coating or immersion-coating.

Obviously, CVD (vacuum methods) are quite expensive. Moreover, cost of equipment and processing grows exponentially with the size of substrate to be processed, so becomes not economical for processing of large areas of substrate materials, like Glass Solar glass panels, architectural windows, Flat panel displays, etc.
It is clear also that conventional non-vacuum methods, like spin-coating and dipping, are not practical for large area material deposition systems.

SUMMARY

Functional material is deposited on the substrate having a polymer template using an applicator in the shape of cylinder or cone. Such template forms an exposed and masked areas of the substrate material. Functional materials, for example, metals, semiconductors, sol-gels, colloids of particles are deposited on the surface of applicator using liquid immersion, soaking, contact with wetted surfaces, vapour deposition or other techniques. Then wetted applicator is contacted the surface of the polymer template and rolled over it's surface. During this dynamic contact functional material is transferred selectively to the areas of the template.

According to the one embodiment, polymer template is made of Self-assembled monolayer (SAM) and terminal group is chosen to have high affinity to the functional material, thus the material creates strong bond only at the areas of template mask.

According to another embodiment, template polymer has low surface energy, thus repels functional materials, and as a result, functional material is deposited only in the exposed areas of the substrate.

According to yet another embodiment, polymer template is fabricated with 2 types of SAMs, one with low surface energy, another with high affinity to the functional material, thus to enhance selectivity of material deposition.

Applicator can be made of elastomeric material, or coated with film of soft and compliant elastomeric material, like for example, PDMS. Multiple applicators can be used on one side of the substrate material to enhance density of functional material deposition.

Alternatively, multiple applicators could be used on the both sides of the substrate coated with polymer template to deposit functional materials on the both sides.

Template and unbounded material can be removed by immersing or flashing substrate with water or solvents after deposition.

BRIEF DESCRIPTION OF THE DRAWINGS

So that the manner in which the exemplary embodiments of the present invention are attained is clear and can be understood in detail, with reference to the particular description provided above, and with reference to the detailed description of exemplary embodiments, applicants have provided illustrating drawings. It is to be appreciated that drawings are provided only when necessary to understand exemplary embodiments of the invention and that certain well known processes and apparatus are not illustrated herein in order not to obscure the inventive nature of the subject matter of the disclosure.

DETAILED DESCRIPTION OF EXEMPLARY EMBODIMENTS

As a preface to the detailed description, it should be noted that, as used in this specification and the appended claims, the singular forms "a", "an", and "the" include plural referents, unless the context clearly dictates otherwise.

When the word "about" is used herein, this is intended to mean that the nominal value presented is precise within ±10%.

Embodiments of the invention relate to methods useful in the deposition of functional materials on the rigid or flexible substrate materials or rolls of films.

We suggest a new method for materials deposition onto a rigid and flexible substrates having a polymer template pattern using "rolling" application.

Template on the substrate can be fabricated using one of the known methods of nanostructuring, including but not limited to nanoimprint lithography, E-beam lithography or interference lithography.

The most preferred and economical large substrate areas patterning scheme is "rolling mask" near-field lithography described by the authors at the earlier filed patent applications PCT/US2008/012901, U.S. Ser. No. 12/384,219 and U.S. Ser. No. 12/384,167

Polymer templates can be made from photoresists (positive or negative) or SAMs—self-assembled monolayers.

Figure 1:
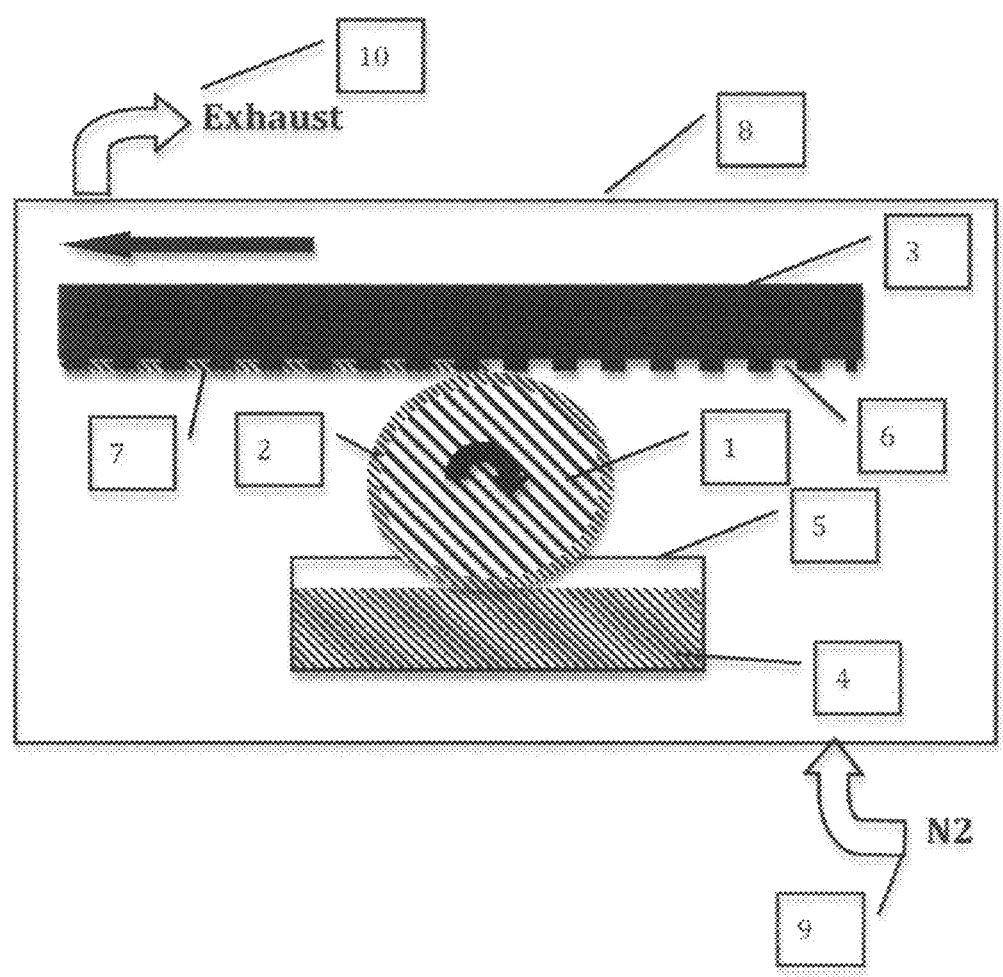
FIG. 1 Schematic representation of the deposition apparatus where functional material 4 is deposited using cylindrical applicator 1 selectively in the exposed areas of the substrate 7 through a template 6

We suggest materials application method by "rolling" applicator over surface of a template. Applicator has a shape of a cylinder or a cone. FIG. 1 represents a cross-section view of the applicator in the form of cylinder 1, laminated with soft polymer material 2, which is brought in contact with a substrate 3 on one side and with a liquid 4 stored in a bath 5, on the other side. The substrate 3 has a pre-fabricated template 6, patterned in accordance with specified mask pattern. When substrate is brought in contact with polymer film 2 and moved linearly, for example, right to left, it turns cylinder 1 counter clock-wise. Alternatively, cylinder 1 can be rotated separately in-synch with the sample movement. During such rotation liquid 4 is transferred from the bath 5 through the polymer film 2 and into the substrate's surface 7. This transfer is driven by capillary forces, which directs liquid from the applicator surface into the valleys (holes, trenches, etc.) of the template, where functional material is adsorbs or reacts with the surface.

Residue of functional material adsorbed on the template film 6 can be further removed along with the template itself during template removal by dissolving it in solvent solution, the process known as "lift-off".

Amount of material deposited onto the substrate can be controlled by many different factors, like viscosity of liquid, speed of applicator rotation, distance or pressure between applicator and a substrate, potentials (charge) on applicator and substrate surfaces, etc.

Deposition system can be set in an enclosure 8 having continuous supply of dry Nitrogen 9 and an exhaust 10 to remove environmental impact (mainly, moisture) on the deposition process and exhaust evaporated solvents and other materials.

A polymer film 2 laminated on the cylindrical applicator 1 can be made of soft material, capable of swelling by deposition materials; such soft material can for example be Polydimethylsiloxane (PDMS) film.

Alternatively, liquid 4 can be supplied to the applicator 1 in-situ by soaking/immersion of a polymer film 2 in a bath 5 or continuous dripping of liquid onto applicator's surface from a nozzles (not shown).

Another method of supplying functional material to the applicator's surface is vapour phase deposition.

Alternatively, multiple cylinders are used in sequence to increase the duration of substrate contact with the deposition material, which would enhance density of functional material deposited on the substrate.

cross-linking and stabilize the layer.

When SAM material is used as a template material there are 2 options for selective deposition of functional materials: The first method is to deposit functional material in the areas free from SAM (valleys), as it is demonstrated on FIG. 1, similar to deposition on regular polymer templated substrate. To do that SAM has to have terminal group which repels deposition material. In this case functional material will stay only in the areas free of SAM. Examples of such terminal groups can be any halogenated hydrocarnons, aliphatic or aromatic. Halogen can be fluorine, chlorine, bromine, iodine, etc. Some examples of useful precursors are: Octadecyltrichlorosilane (OTS), Octyltrichlorosilane (OTCS), Dodecyltrichlorosilane (DDTCS), dimethyldichlorosilane (DDMS), tridecafluoro-1,1,2,2-tetrahydrooctyltrichlorosilane (FOTS), heptadecafluoro-1,1,2,2-tetrahydrodecyltrichlorosilane (FDTS), (tridecafluoro-1,1,2,2,-tetrahydrooctyl)trisdimethylamino silane (PF8TAS), (heptadecafluoro-1,1,2,2,-tetrahydrodecyl)tris-dimethylamino silane (PF10TAS), octylsilane, n-dodecanethiolate, n-octadecanethiol, etc.

Figure 2:
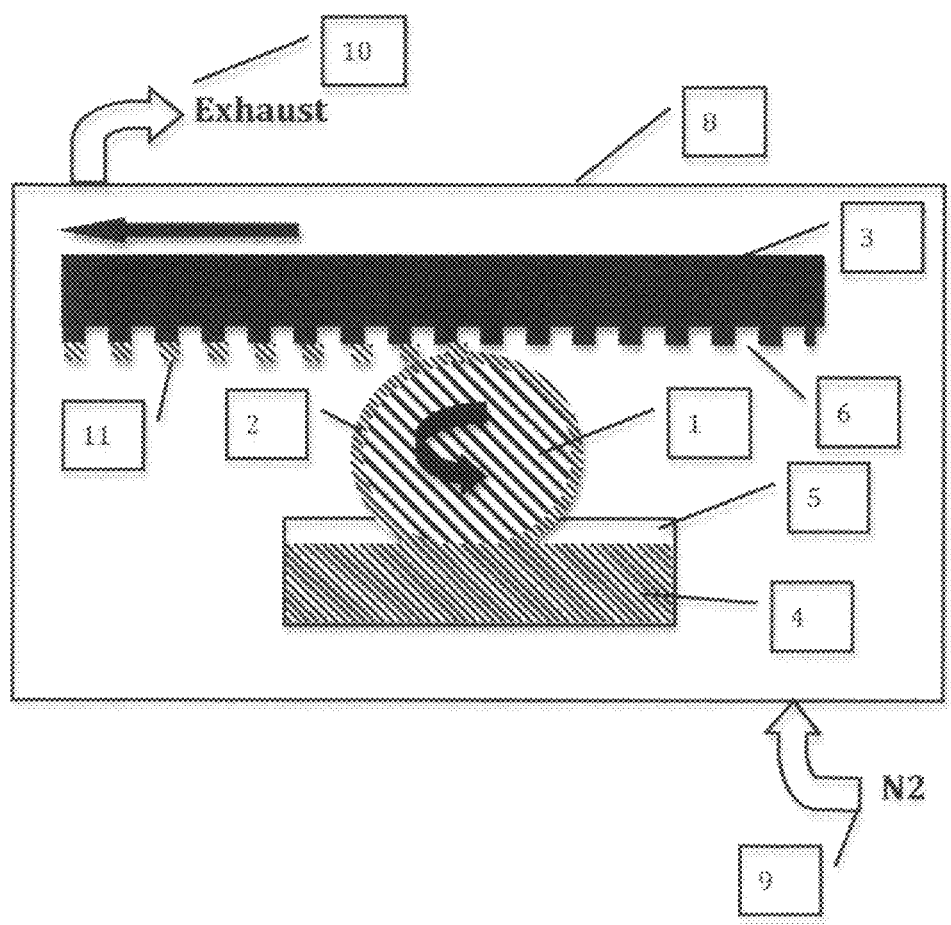
FIG. 2 Schematic representation of the deposition apparatus where functional material 4 is deposited using cylindrical applicator 1 selectively onto the polymer template 6

The second method is to deposit functional material only on top of SAM template 6, and leave exposed substrate surface uncoated, as demonstrated on FIG. 2. In order to do that SAM should have terminal groups having good affinity to the functional material. There are plenty of known combinations of SAM's terminal groups with different materials, which one can use to engineer selective material deposition onto SAM template.

For example, noble metal, like Au, Ag, Pt, and also Cu, Ni, Zn, Ru, Zn, Ge can be attached to SAMs having mercapto, amino or cyano ligand as terminal group; Si, $SiO_2$, $TiO_2$, $Fe_2O_3$, other oxides can be attached successfully to SAMs having R—OH ligand. In this case, metals or other materials could be transferred in liquid (from a solution) or dry (as material, for example, sputtered on applicator's surface) forms.

Figure 3:
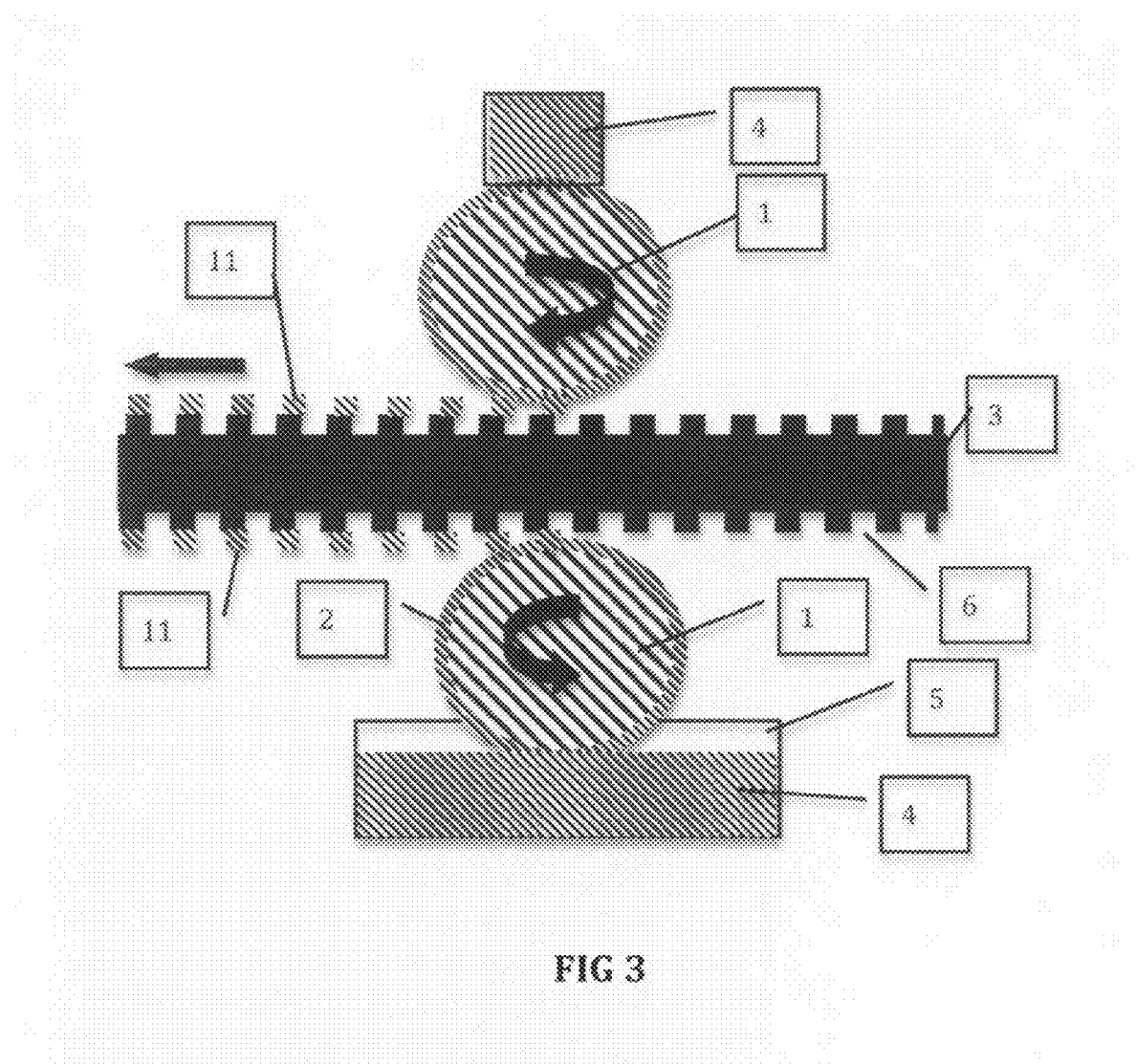
FIG. 3 Schematic representation of the deposition apparatus where functional material 4 is deposited using 2 cylindrical applicators 1 selectively onto the polymer template 6 on the both sides of the substrate 3

FIG. 3 represents material deposition on both sides of the substrate 3 using two cylindrical applicators 1, one of which is rotating in clockwise direction, another in counter clock wise direction, and the substrate is moving right to left.

Substrate or film can be further flashed with water or solvents, like alcohols, to remove loosely bound access of material.

Substrate or film can be further heat treated by blowing hot inert gas (nitrogen) or by exposure to Infrared light using lamps, for example, to reduce metal-oxide to metal.

Subsequently, template material can be removed from the substrate by dissolving in a solvent or other means.

Functional materials, which can be deposited using suggested method can be metals, semiconductors, oxides, metal-oxides, hybrid organic-inorganic materials, polymers, oligomers, organic molecules, photoresists, magnetic materials, piezo materials, colloids of micro or nanoparticles.

EXAMPLES OF MATERIAL DEPOSITION

Example-1

Template is fabricated on $SiO_2$ substrate using tridecafluoro 1,1,2,2-tetrahydrooctyltrichlorosilane SAM, which is patterned using Rolling Mask Near-field UV lithography in the presence of oxygen or ozone. This SAM materials does have a chlorosilane head group, which binds very effectively to oxide surface, and fluorinated hydrocarbon terminal group, which forms the low surface energy Teflon-like surface.

In the experiments described below cylinder with PDMS film has been wetted with the following functional materials and rolled onto the substrate's surface:

Copper dimethylamino-2-propoxyde dissolved in alcohol (ethanol) for copper deposition. The substrate is then heat treated at 210 C in Nitrogen environment using IR lamps after deposition to obtain copper material.

Silver(hexafluoroacetylacetonate-(1,5-cyclooctadiene) dissolved in organic solvent (butanol, ethanol or toluene) for silver deposition. The substrate is heat treated at 300 C using IR lamps after deposition to obtain silver material.

Poly(3,4-ethylenedioxythiophene)/poly(4-styrenesulphonate) for PEDOT/PSS conducting polymer deposition.

Polyaniline (PANI)-poly)2-acrylamido-2-methyl-1-propanesulfonic acid (PAAMPSA), 5-10 wt % in water as an organic conductor material Example-2

Template is fabricated on SiO2 substrate using tridecafluoro 1,1,2,2-tetrahydrooctyltrichlorosilane SAM, which is patterned using Rolling Mask Near-field UV lithography in the presence of oxygen or ozone. This SAM materials does have a chlorosilane head group, which binds very effectively to oxide surface, and fluorinated hydrocarbon terminal group, which forms the low surface energy Teflon-like surface.
Then, cylinder with PDMS film was wetted with colloid solution of Ag nanoparticles in ethanol. Nanoparticles size has been 5-10 nm. Wetted cylindrical applicator has been rolled onto the substrate's surface.
Substrate has been heated with IR lamps to temperatures about 100 C during deposition and to 200 C after deposition to facilitate solvent evaporation.

Example-3

Template is fabricated on SiO2 surface using mercaptopropyltrichlorosilane SAM, which is patterned using Rolling Mask Near-field UV lithography in the presence of oxygen or ozone. This SAM has a chlorosilane head group, which binds very effectively to oxide surface, and a thiol (SH) terminal group, which attracts to noble metals.
Then, cylinder with PDMS film was wetted with colloid solution of Ag nanoparticles in ethanol. Nanoparticles size has been 5-10 nm. Wetted cylindrical applicator has been rolled onto the substrate's surface. As a result, nanoparticles are bonded to SAM template due to attraction between gold and thiol terminal groups.
SAM layer is not removed after the process. Structure is annealed using IR lamps to remove solvent.

Example-4

Template is fabricated on SiO2 surface using mercaptopropyltrichlorosilane SAM, which is patterned using Rolling Mask Near-field UV lithography in the presence of oxygen or ozone. This SAM has a chlorosilane head group, which binds very effectively to oxide surface, and a thiol (SH) terminal group, which attracts to noble metals.
Then, cylinder with PDMS film was coated with tridecafluoro 1,1,2,2-tetrahydrooctyltrichlorosilane SAM using immersion technique or CVD, and then with Au layer (50 nm) using sputtering.
Then Au layer was transferred from the PDMS surface into the SAM template on the substrate selectively by contact during rolling the applicator on the substrate surface.

Example-5

Template is fabricated on Polyethylene terephtalate (PET) substrate coated with ITO. Template material is a polymer, which is patterned using UV Nanoimprint lithography. Residual layer is etched after the process as to expose ITO surface. Since remaining polymer material islands have lower surface energy in comparison to the exposed ITO surface, thus functional material binds preferably to ITO rather than to polymer surface.
Then cylinder with PDMS film was wetted with an organic conductor material-Polyaniline (PANI)-poly)2-acrylamido-2-methyl-1-propanesulfonic acid (PAAMPSA), 5-10 wt % in water, has been rolled over the substrate surface.
Excess of PANI has been removed by flashing substrate with an isopropanol.

Example-6

Template is fabricated on Si wafer coated with thin film of amorphous Si, which is patterned with polymer material using Nanoimprint lithography. This polymer material has low surface energy, thus repels any materials upon contact.
Then cylinder with PDMS film has been wetted with Silver (hexafluoroacetylacetonate-(1,5-cyclooctadiene) dissolved in ethanol. The substrate is heat treated at 300 C using IR lamps after deposition to obtain silver material.

I claim:

1. A method of deposition of a functional material over template, comprising:
    providing a substrate having one or more masking materials deposited on a surface of the substrate and wherein the one or more masking materials are patterned to form a template,
    coating an applicator in a shape of cylinder or cone with functional material, transferring said functional material from said applicator onto the patterned masking materials on the surface of the substrate by
    rolling said applicator over the surface of the substrate.
2. A method according to 1 wherein said masking material is a photoresist.
3. A method according to 1 wherein said masking material is a Self assembled monolayer (SAM) material.
4. A method according to 3 wherein said SAM material consists of molecules having terminal groups with low surface energy.
5. A method according to 4 wherein said terminal group is halogenated hydrocarbon, aliphatic or aromatic.
6. A method according to 3 wherein said SAM material consists of molecules having terminal groups with high affinity to functional material.
7. A method according to 3 wherein SAM material consists of 2 types of SAMs molecules, and only 1 of them has terminal group with high affinity to functional material.
8. A method according to 1 wherein said functional material is a metal or metal-oxide materials.
9. A method according to 1 wherein said functional material is a sol-gel.
10. A method according to 1 wherein said functional material is a semiconductor.
11. A method according to 1 wherein said template pattern has features less than 500 nm.
12. A method according to 1 wherein said applicator is made of a silicone elastomer.
13. A method according to 1 wherein coating of said application is done by immersion in or contacting a liquid containing a functional material.
14. A method according to 1 wherein coating of said applicator is done by vapor deposition.

15. A method according to 1, further comprising additional applicator positioned on the other side of the said substrate to provide deposition on both sides of said substrate.

16. A method according to 8 further comprising heating a substrate to convert metal oxide precursor to pure metal or metal oxide solid material.

17. A method according to 1 wherein functional material is in the form of particles or colloid of particles.

18. A method according to 17 wherein said particles size is less than 100 nm.

19. A method according to 1 wherein further said template is removed by immersion in a solvent.

20. A method according to 1 wherein said functional material is removed by further rinsing substrate with water or solvent.

* * * * *